United States Patent
Patra (10) Patent No.: US 8,896,816 B2
(45) Date of Patent: Nov. 25, 2014

(54) PROJECTION EXPOSURE METHOD, PROJECTION EXPOSURE APPARATUS, LASER RADIATION SOURCE AND BANDWIDTH NARROWING MODULE FOR A LASER RADIATION SOURCE

(75) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 637 days.

(21) Appl. No.: 13/208,472

(22) Filed: Aug. 12, 2011

(65) Prior Publication Data

US 2011/0304837 A1 Dec. 15, 2011

Related U.S. Application Data

(63) Continuation of application No. PCT/EP2010/000669, filed on Feb. 4, 2010.

(30) Foreign Application Priority Data

Feb. 17, 2009 (DE) .......................... 10 2009 010 560

(51) Int. Cl.

| | | |
|---|---|---|
| G03B 27/72 | (2006.01) | |
| G03F 7/20 | (2006.01) | |
| G02B 27/48 | (2006.01) | |
| H01S 3/225 | (2006.01) | |
| H01S 3/08 | (2006.01) | |

(52) U.S. Cl.
CPC ........ *G03F 7/70583* (2013.01); *G03F 7/70041* (2013.01); *G03F 7/70575* (2013.01); *G02B 27/48* (2013.01); *H01S 3/225* (2013.01); *H01S 3/08009* (2013.01)
USPC ........................................................ 355/69

(58) Field of Classification Search
CPC ............ G03F 7/70583; G03F 7/70575; G03F 7/70041; G03F 7/70025; G02B 27/48
USPC .......................................................... 355/69
See application file for complete search history.

(56) References Cited

U.S. PATENT DOCUMENTS

| | | |
|---|---|---|
| 5,760,408 A | 6/1998 | Kikuchi et al. |
| 6,128,030 A | 10/2000 | Kikuchi et al. |
| 6,898,216 B1 | 5/2005 | Kleinschmidt |
| 2006/0146310 A1 | 7/2006 | De Kruif et al. |
| 2008/0225921 A1 | 9/2008 | Kuss et al. |

FOREIGN PATENT DOCUMENTS

JP 9-162104 6/1997

OTHER PUBLICATIONS

German Office Action, with English translation, for corresponding DE Appl No. 10 2009 010 560.3, dated Oct. 19, 2009.
International Search Report for the corresponding PCT Application No. PCT/EP2010/000669, mailed May 6, 2010.
International Preliminary Report on Patentability for the corresponding PCT Application No. PCT/EP2010/000669, mailed Aug. 23, 2011.
Chen X. et al., "0.1 μm node main lithography—193 nm( ArF) lithography", Equipment for Electronic Products Manufacturing, vol. 31 No. 1, Mar. 2002, with English Abstract.
Gong Y. et al., "Present status and progress in 193nm exposure system in lithography," Chinese Journal of Optics and Applied Optics, vol. 1 No. 1, Dec. 2008, with English Abstract.

*Primary Examiner* — Chia-how Michael Liu
(74) *Attorney, Agent, or Firm* — Fish & Richardson P.C.

(57) ABSTRACT

In a projection exposure method for the exposure of a radiation-sensitive substrate arranged in the region of an image surface of a projection objective with at least one image of a pattern of a mask arranged in the region of an object surface of the projection objective, laser radiation having a spectral intensity distribution $I(\omega)$ dependent on the angular frequency $\omega$ is used. The laser radiation is characterized by an aberration parameter $\alpha$ in accordance with:

$$\alpha := \frac{\int I(\omega)\omega^2 d\omega}{\int I(\omega)d\omega}$$

and a coherence time $\tau$ in accordance with:

$$\tau = \frac{\int I(\omega)^2 d\omega}{[\int I(\omega)d\omega]^2}$$

The laser radiation is introduced into an illumination system for generating an illumination radiation directed onto the mask, and the pattern is imaged onto the substrate with the aid of a projection objective. The spectral intensity distribution is set so that $\alpha\tau^2 \leq 0.3$. The influence of temporally varying speckles on image generation can be reduced by comparison with conventional methods, without simultaneously increasing the influence of chromatic aberrations on image generation.

19 Claims, 4 Drawing Sheets

PROJECTION EXPOSURE METHOD, PROJECTION EXPOSURE APPARATUS, LASER RADIATION SOURCE AND BANDWIDTH NARROWING MODULE FOR A LASER RADIATION SOURCE

CROSS-REFERENCE TO RELATED APPLICATIONS

This application is a continuation of PCT/EP2010/000669, filed on Feb. 4, 2010, which claims priority to German Patent Application No. DE 10 2009 010 560.3, filed on Feb. 17, 2009, the entire contents of both which are incorporated herein by reference.

FIELD OF THE DISCLOSURE

The disclosure relates to a projection exposure method for the exposure of a radiation-sensitive substrate arranged in the region of an image surface of a projection objective with at least one image of a pattern of a mask arranged in the region of an object surface of the projection objective, a projection exposure apparatus suitable for carrying out the method, and also a laser radiation source and a bandwidth narrowing module for a laser radiation source.

BACKGROUND

Nowadays, microlithographic projection exposure methods are predominantly used for producing semiconductor components and other finely structured devices. In this case, masks (reticles) are used which bear the pattern of a structure to be imaged, e.g., a line pattern of a layer of a semiconductor component. A mask is positioned into a projection exposure apparatus between an illumination system and a projection objective in the region of the object surface of the projection objective and is illuminated with an illumination radiation provided by the illumination system. The radiation altered by the mask and the pattern passes as projection radiation through the projection objective, which images the pattern of the mask onto the substrate to be exposed, which normally bears a radiation-sensitive layer (photoresist).

Current projection exposure apparatuses for high-resolution microlithography in the deep or very deep ultraviolet range (DUV or VUV) generally use a laser as primary light source. In particular, KrF excimer lasers having an operating wavelength of approximately 248 nm or ArF excimer lasers having an operating wavelength of approximately 193 nm are conventional. $F_2$ lasers are employed for an operating wavelength of 157 nm, and $Ar_2$ excimer lasers can be used at 126 nm. The primary laser radiation source emits a laser beam composed of laser light, which is received by the connected illumination system and reshaped in order to generate an illumination radiation directed onto the mask. The spectral properties of the illumination radiation and of the projection radiation, that is to say their properties dependent on the wavelength $\lambda$ or the angular frequency $\omega$, are in this case substantially determined by the spectral properties of the primary laser radiation.

In the design of a lithography process, line widths of the structures on the reticle are adapted in such a way that after imaging with the aid of the projection objective using an illumination assumed to be known, the desired structure sizes are exposed in the light-sensitive layer. In this case, it is important for identical structures of the mask to be imaged identically in the photoresist independently of the location on the substrate. Otherwise, in the case of semiconductor components, price-reducing losses of speed or in the worst case even functional losses can occur. One critical variable in semiconductor production, therefore, is the change in the thickness of the critical structures (CD) which is brought about by the process, and which is also designated as "variation of the critical dimensions" or "CD variation". Accordingly, a uniform width of imaged identical structures over the field, so-called CD uniformity, constitutes an essential quality criterion of lithography processes.

A determining factor for the width of a structure in the photoresist is the radiation energy deposited there. It is assumed to a customary approximation that the photoresist is exposed above a specific deposited amount of radiation energy, and is not exposed below that amount. The limit value for the amount of radiation energy is also designated as "resist threshold". What is important in this case is the radiation intensity integrated during a total exposure time at a location on the substrate. The magnitude of the radiation energy deposited at a specific location in the photoresist is dependent on a large number of influencing variables, inter alia on optical aberrations, in particular on chromatic aberrations, on the polarization state of the exposure radiation and also on the influence of stray light and double reflections. If a laser is used as primary light source, then the influence of so-called speckles, which can arise when using at least partially coherent radiation as a result of self-interference, can be added as a further potential cause of CD variations. So-called temporally varying speckles (dynamic speckles, temporal speckles) are primarily important here, these being caused by temporal intensity fluctuations resulting from the fact that use is made of a light source having a coherence time which is not very much shorter than the duration of a laser pulse. By contrast, the coherence time of typical incoherent light sources is so short that temporally varying speckles are not a problem in that case.

Numerous influencing parameters should be taken into consideration when selecting suitable laser radiation sources for a microlithography projection exposure apparatus. Particularly in the case of high-resolution projection objectives with a large image field, chromatic correction is very complex. If a projection objective is not fully chromatically corrected, then radiation having different wavelengths produces for each wavelength a different focal position in the image field of the projection objective. In order to avoid the resultant disadvantages it is generally endeavored to use very narrow-band laser radiation sources. Conventional excimer lasers therefore contain bandwidth narrowing modules which narrow the natural emission spectrum of the laser of a few hundred µm by several powers of ten, for example to bandwidths of less than 1 pm. Large bandwidths are thus disadvantageous with regard to the chromatic aberrations. By contrast, large bandwidths are rather expedient with regard to the arising of dynamic speckles, since the undesirable interference phenomena designated as speckles are attributable to the temporal coherence of the light. Since the light is less coherent, the more different wavelengths are contained in the laser radiation, large bandwidths can be expedient with regard to avoiding speckles.

Therefore, the selection of a suitable bandwidth is generally a compromise between the requirements for low chromatic aberrations, on the one hand, and few speckles, on the other hand. The setting of the optimum bandwidth is a technological question that has to be decided when designing each projection exposure apparatus on the basis of the available data, for example for the chromatic correction of the projection objective.

SUMMARY

It is an object of the disclosure to provide a projection exposure method and a projection exposure apparatus designed for carrying out said method which operate with a laser as primary light source and which are designed to reduce the influence of temporally varying speckles on image generation by comparison with conventional systems and methods, without simultaneously increasing the influence of chromatic aberrations on image generation. Furthermore, the intention is to provide a laser radiation source suitable for carrying out the projection exposure method and also a bandwidth narrowing module for a laser radiation source.

This object is achieved by means of a projection exposure method comprising the features of claim 1, by means of a projection exposure apparatus comprising the features of claim 6, and also by means of a laser radiation source comprising the features of claim 11 and a bandwidth narrowing module comprising the features of claim 14. Advantageous developments are specified in the dependent claims. The wording of all the claims is incorporated by reference in the content of the description.

It has been recognized that it is possible, through suitable setting of the spectral shape of the laser line, that is to say through setting of the spectral intensity distribution of the laser radiation emitted by the primary laser radiation source, to influence in a targeted manner the balance between the influence of the laser radiation source on the chromatic aberrations and the influence of the laser radiation source on the arising of dynamic speckles.

The setting of a suitable spectral shape of a laser line constitutes a degree of freedom that has not been taken into consideration heretofore in the design of lithography apparatuses and processes.

The spectral intensity distribution of the laser line used has two opposite influences on the lithography process: a wide laser line increases the chromatic aberrations, while a narrow laser line can lead to a long coherence time and thus to severe dynamic speckles. Heretofore, substantially only the chromatic aberrations have been drivers in the laser roadmap. Therefore, considerable efforts have been made to develop laser radiation sources having the narrowest possible bandwidth. It has now been recognized that the dynamic speckles also have to be considerably reduced in order to obtain original-true readings with only acceptably low CD variations, such that both influences have to be taken into account.

The formulation of the disclosure as indicated above describes how the dynamic speckles can be minimized by adapting the spectral shape of the laser line, without worsening the chromatic aberrations in the process. This can be understood as follows.

Let $I(\omega)$ be the spectral shape of the laser line. For reasons of simpler notation, the angular frequency $\omega$ is used hereinafter instead of the wavelength $\lambda$. On the basis of $$d\lambda = -\frac{c_0}{2\pi\omega^2}d\omega$$

with the speed of light $c_0$, for all situations relevant here $d\lambda$ and $d\omega$ are proportional ($d a|d\omega|\ll\omega$), such that angular frequency and wavelength are fully equivalent notations. Furthermore, it is assumed hereinafter that the laser line has its center at angular frequency $\omega=0$, since otherwise, in equations (1) ff. indicated below, $(\omega-\omega_0)^2$ would have to be written each time instead of $\omega^2$.

The chromatic aberrations (or their effects for the lithography process) are proportional to the second moment of the spectral distribution, that is to say $$\alpha := \frac{\int I(\omega)\omega^2 d\omega}{\int I(\omega)d\omega} \tag{1}$$

By contrast, the dynamic speckles are determined by the temporal autocorrelation $\mu(\Delta t)$. The coherence time $\tau$ is produced by means of $$\tau = \int \mu(\Delta t)^2 d\Delta t \tag{2}$$

Dynamic speckles become weaker if the coherence time $\tau$ is small, since it is then possible to effect averaging over more statically independent radiation distributions within a laser pulse. The autocorrelation can be calculated from the normalized spectral intensity distribution by means of Fourier transformation (FT), $$\mu(\Delta t) \xleftarrow{FT} \frac{I(\omega)}{\int I(\omega)d\omega} \tag{3}$$

Since, as is known, Fourier transformation maintains the $L_2$ norm, equation (2) is equivalent to $$\tau = \frac{\int I(\omega)^2 d\omega}{[\int I(\omega)d\omega]^2} \tag{4}$$

For the lithography process it is thus optimal if a spectral line shape $I(\omega)$ is used in which equation (1) and equation (4) are as small as possible. From unit consideration it is directly apparent that the dimensionless product $\alpha\tau^2$ is the relevant variable, that is to say that a line shape is all the better suited to the lithography process, the smaller its product $\alpha\tau^2$. Since this product parameterizes the spectral shape of the laser line, the product is also designated hereinafter as "line shape parameter" $\alpha\tau^2$ or simply as "shape parameter" $\alpha\tau^2$.

In some embodiments, for the line shape parameter $\alpha\tau^2$, the condition $\alpha\tau^2<0.1$ holds true. In particular, the condition $\alpha\tau^2\leq0.09$ or $\alpha\tau^2\leq0.08$ can be met.

For a further understanding of the background, some principles concerning line widths and profiles of spectral lines shall firstly be mentioned. In the emission of electromagnetic radiation which are based on a transition between two energy levels of the atomic system, the frequency of the corresponding spectral lines is not strictly monochromatic. A frequency distribution of the intensity of the emitted intensity around a center frequency is observed. The frequency interval between those two frequencies at which the intensity has fallen to half of the intensity maximum present at the center frequency is called the full width at half maximum (FWHM). The term "bandwidth" is also used for full width at half maximum in this application. In general, the spectral range within the full width at half maximum is designated as line core, while the regions on both sides outside the line core are designated as line wings.

An excited atomic electron can emit its excitation energy again in the form of electromagnetic radiation (spontaneous emission). During a spontaneous emission, an atom does not emit the radiation strictly monochromatically, rather the emitted radiation has a frequency-dependent internal distribution. Without external influences, the atom emits the radiation with the so-called "natural line shape", which is described by a Lorentz profile. The full width at half maximum of the Lorentz profile is the so-called natural line width of the emission process.

For the area of laser physics, however, the Lorentz profile is only a coarse approximation that is valid in the direct vicinity of the center of the line, that is to say around the center frequency. A realistic approach that is widely used in laser physics is that of a modified Lorentz curve, which can serve as a realistic reference for the comparison of different laser line shapes. This will be explained in greater detail in the description of preferred exemplary embodiments.

A significant reduction of the line shape parameter $\alpha\tau^2$ in comparison with the line shape parameter in the case of a modified Lorentz curve can be achieved when the spectral intensity distribution $I(\omega)$ substantially corresponds to a Gaussian curve of the width $\sigma$, wherein $\alpha=\sigma^2/2$ and $\tau=1/(\sqrt{2\pi}\sigma)$ hold true in the case of the Gaussian curve. A spectral intensity distribution $I(\omega)$ substantially corresponds to a Gaussian curve in particular when, in fitting a Gaussian curve to a measured intensity profile, only small deviations or errors arise, for example errors of less than 10% or less than 8% or less than 5% or less than 2%.

A further reduction of the line shape parameter $\alpha\tau^2$ is possible when the spectral intensity distribution $I(\omega)$ substantially has a parabolic shape. A spectral intensity distribution $I(\omega)$ substantially corresponds to a parabolic shape in particular when, in fitting a parabola to a measured intensity profile, only small deviations or errors arise, for example errors of less than 15% or less than 10% or less than 8% or less than 5% or less than 2%. In comparison with a Gaussian curve or a modified Lorentz curve, in the case of a parabolic shape, there is also less radiation energy in the region of the line wings and correspondingly more radiation energy in the region of the line core, which has proved to be expedient for the optimization with regard to chromatic aberration and speckles. In particular, the flanks of a parabolic intensity profile have no point of inflection in the profile $I(\omega)$, which makes it very clear that in the case of a parabolic profile a relatively large amount of energy lies in the region of the line core and relatively little energy lies in the region of the line wings.

The disclosure also relates to a projection exposure apparatus comprising a primary laser radiation source for emitting laser radiation for which the condition $\alpha\tau^2 \leq 0.3$ holds true.

The disclosure also relates to a laser radiation source for emitting laser radiation for which the condition $\alpha\tau^2 \leq 0.3$ holds true.

The disclosure also relates to a bandwidth narrowing module for a laser radiation source, wherein the bandwidth narrowing module is designed such that a laser radiation source equipped therewith emits laser radiation for which the condition $\alpha\tau^2 \leq 0.3$ holds true.

The above and further features emerge not only from the claims but also from the description and from the drawings, wherein the individual features can in each case be realized by themselves or as a plurality in the form of subcombinations in an embodiment of the disclosure and in other fields and can constitute advantageous and inherently protectable embodiments. Exemplary embodiments of the disclosure are illustrated in the drawings and explained in greater detail below.

BRIEF DESCRIPTION OF THE DRAWINGS

FIG. 2 shows in 2A a schematic spectral line profile of a laser and in 2B the influence of a finite spectral bandwidth of a laser radiation source on the focus position when using a projection objective that is not fully chromatically corrected;

DETAILED DESCRIPTION

Figure 1:
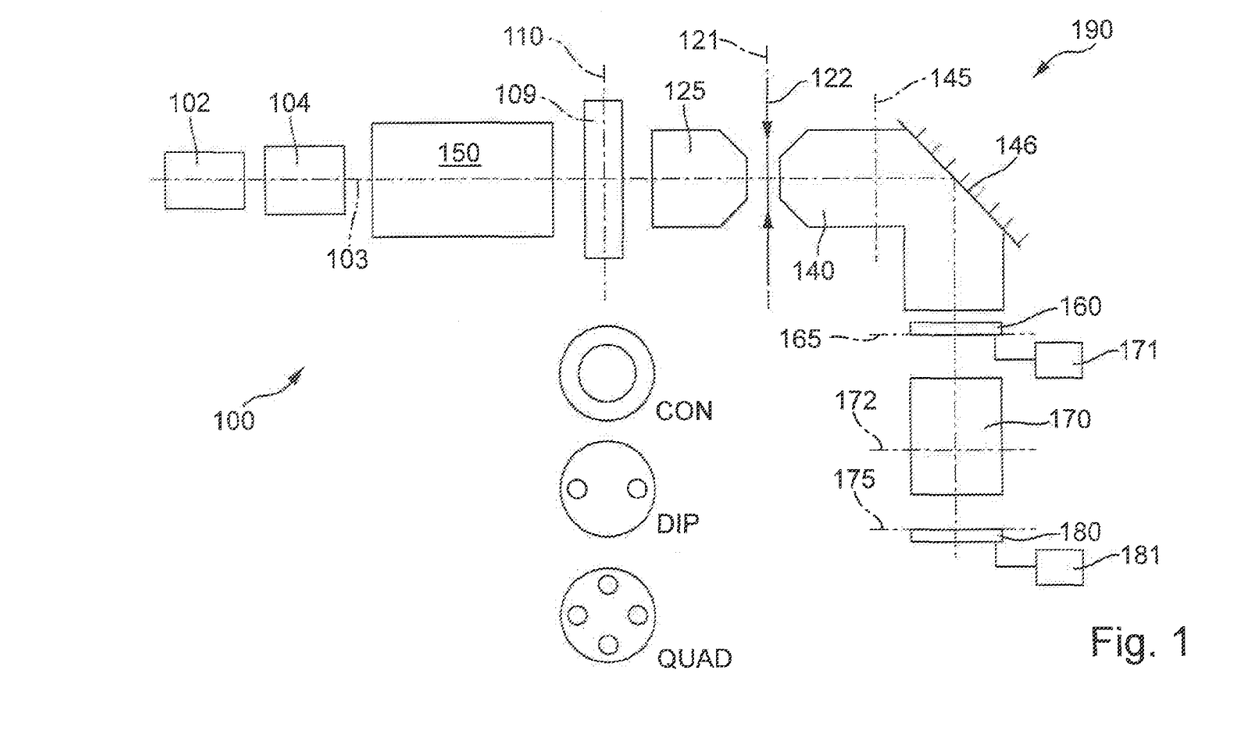
FIG. 1 schematically shows the construction of a projection exposure apparatus for microlithography.

FIG. 1 shows an example of a microlithography projection exposure apparatus 100 which can be used in the production of semiconductor components and other finely structured devices and operates with light or electromagnetic radiation from the deep ultraviolet range (VUV) in order to obtain resolutions down to fractions of micrometers. An ArF excimer laser having an operating wavelength of approximately 193 nm serves as primary light source 102, the linearly polarized laser beam of which laser is coupled into the illumination system 190 coaxially with respect to the optical axis 103 of the illumination system. Other UV laser radiation sources, for example $F_2$ lasers having an operating wavelength of 157 nm, or KrF excimer lasers having an operating wavelength of 248 nm are likewise possible.

The polarized light from the light source 102 firstly enters into a beam expander 104, which serves for example for reducing the coherence and increasing the beam cross section. The expanded laser beam enters into a pupil shaping unit 150, which contains a multiplicity of optical components and groups and is designed to generate in a downstream pupil shaping surface 110 of the illumination system 190 a defined, local (two-dimensional) illumination intensity distribution, which is sometimes also designated as secondary light source or as "illumination pupil". The pupil shaping surface 110 is a pupil surface of the illumination system.

The pupil shaping unit 150 can be set in a variable fashion, such that different local illumination intensity distributions (that is to say differently structured secondary light sources) can be set depending on the driving of the pupil shaping unit. FIG. 1 schematically shows by way of example various illuminations of the circular illumination pupil, namely a conventional setting CON with a centered, circular illumination spot, a dipole illumination DIP or a quadrupole illumination QUAD.

Arranged in direct proximity to the pupil shaping surface 110 is an optical raster element 109. A coupling-in optical unit 125 arranged downstream of the latter transmits the light onto an intermediate field plane 121, in which a reticle/masking system (REMA) 122 is arranged, which serves as an adjustable field stop. The optical raster element 109, which is also designated as a field-defining element FDE, has a two-dimensional arrangement of diffractive or refractive optical elements and shapes the entering radiation in such a way that it illuminates a rectangular illumination field after passing through the downstream coupling-in optical unit 125 in the region of the field plane 121. The radiation is additionally homogenized by the superimposition of partial beam bundles, such that the FDE serves as a field shaping and homogenizing element.

The downstream imaging objective 140 (also called REMA objective) images the intermediate field plane 121 with the field stop 122 onto the reticle 160 (mask, lithography original) on a scale which can lie between 2:1 and 1:5, for example, and is approximately 1:1 in the embodiment.

Those optical components which receive the light from the laser 102 and shape from the light illumination radiation that is directed onto the reticle 160 belong to the illumination system 190 of the projection exposure apparatus.

Arranged downstream of the illumination system is a device 171 for holding and manipulating the reticle 160 in such a way that the pattern arranged on the reticle lies in the object plane 165 of the projection objective 170 and can be moved in this plane for scanner operation in a scan direction (y direction) perpendicular to the optical axis 103 (z direction) with the aid of a scan drive.

Downstream of the reticle plane 165 there follows the projection objective 170, which acts as a reducing objective and images an image of the pattern arranged on the mask 160 on a reduced scale, for example on a scale of 1:4 or 1:5, onto a wafer 180 coated with a photoresist layer, the light-sensitive surface of said wafer lying in the image plane 175 of the projection objective 170. Refractive, catadioptric or catoptric projection objectives are possible. Other reducing scales, for example greater reductions of up to 1:20 or 1:200, are possible.

The substrate to be exposed, which is a semiconductor wafer 180 in the case of the example, is held by a device 181 comprising a scanner drive in order to move the wafer synchronously with the reticle 160 perpendicular to the optical axis. Depending on the design of the projection objective 170 (e.g. refractive, catadioptric or catoptric, without intermediate image or with intermediate image, folded or unfolded), these movements can be effected in a manner parallel or antiparallel with respect to one another. The device 181, which is also designated as "wafer stage", and the device 171, which is also designated as "reticle stage", are part of a scanner device controlled by means of a scan control device.

The pupil shaping surface 110 lies at or near a position which is optically conjugate with respect to the nearest downstream pupil surface 145 and to the image-side pupil surface 172 of the projection objective 170. Consequently, the spatial (local) light distribution in the pupil 172 of the projection objective is determined by the spatial light distribution (spatial distribution) in the pupil shaping surface 110 of the illumination system. Between the pupil surfaces 110, 145, 172, field surfaces which are Fourier-transformed surfaces relative to the respective pupil surfaces respectively lie in the optical beam path. This means, in particular, that a defined spatial distribution of illumination intensity in the pupil shaping surface 110 produces a specific angular distribution of the illumination radiation in the region of the downstream field surface 121, which in turn corresponds to a specific angular distribution of the illumination radiation incident on the reticle 160.

Figure 2A:
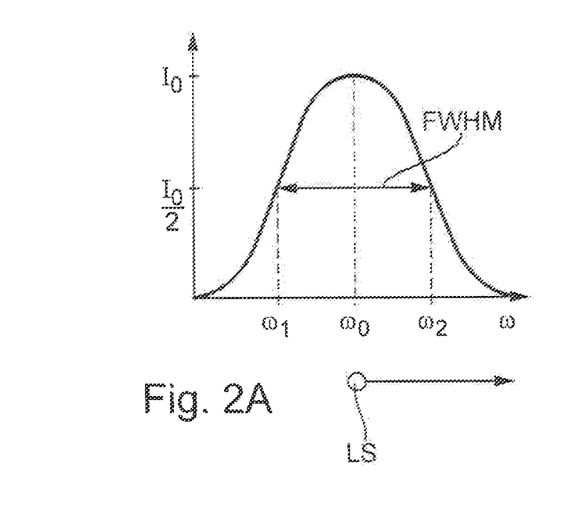
Figure 2B:
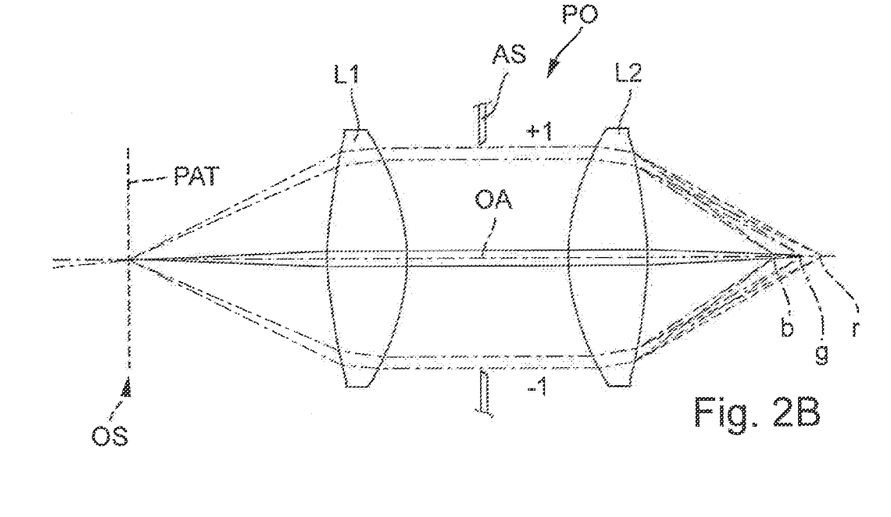

The laser radiation source 102 emits laser radiation having a specific spectral intensity profile $I(\omega)$ dependent on the wavelength $\lambda$ or on the angular frequency $\omega$. The effects of the use of a light source having a finite bandwidth on the image quality when using a projection objective that is not fully chromatically corrected are explained schematically with reference to FIG. 2.

For this purpose, FIG. 2A schematically shows the spectral intensity profile $I(\omega)$ of the laser radiator source LS. The maximum of the intensity, $I_0$, is at the center frequency $\omega_0$. The frequency interval $\Delta\omega = |\omega_2 - \omega_1|$ between the two frequencies $\omega_1$ and $\omega_2$ at which the intensity has fallen to half the maximum value is called the full width at half maximum (FWHM). It is evident that the laser line includes different wavelengths that contribute with different intensities to the total signal. The spectral range within the full width at half maximum is also designated as the line core, and the regions outside are designated as line wings.

FIG. 2B schematically shows a projection objective PO having two lens elements L1, L2 arranged coaxially with respect to the optical axis OA, which represent the imaging system which image the pattern PAT situated in the object surface OS of the projection objective into the region of the image surface IS that is optically conjugate with respect to the object surface. An aperture stop AS defines the effective image-side numerical aperture NA of the imaging and is arranged in the vicinity of a pupil surface of the objective. The pattern PAT of the mask is illustrated schematically as a diffraction grating which diffracts the illumination light provided by the illumination system into a 0th diffraction order along the optical axis and also a −1st diffraction order and a +1st diffraction order at the outer edge of the beam path delimited by the aperture stop.

The broadband laser radiation source LS emits radiation having different wavelengths having different intensities, wherein, in accordance with the colors of the light in the visible spectral range, the average wavelength is designated by "g" for "green", the longest wavelength is designated by "r" for "red" and the shortest wavelength is designated by "b" for "blue". It goes without saying that the ratios for wavelengths from the deep ultraviolet range of below 260 nm should be applied correspondingly. In the case of a system with chromatic undercorrection, the focal plane of the relatively shortest wavelength (b) then lies closer to the optical system, while the relatively longer wavelengths (g) and (r) are focused progressively further away from the projection objective. However, the substrate to be exposed, for example a semiconductor wafer, can be brought exactly into the focal region only with respect to one of the wavelengths, and the focal positions of the other wavelengths then lie outside the surface to be exposed.

The focal position changes to a first approximation linearly with the wavelength (in the case of a chromatically corrected objective this effect would only be quadratic with the wavelength). The variation of the critical dimensions ($\Delta CD$) accordingly rises quadratically with the change in wavelength. It is evident from this that the chromatic aberrations, or their effect for the lithography process, are proportional to the second moment of the spectral distribution, which, for the purposes of this application, is parameterized by the aberration parameter $\alpha$, for which the following holds true:

$$a := \frac{\int I(\omega) \omega^2 d\omega}{\int I(\omega) d\omega} \tag{1}$$

Alongside the wavelength dependence of the focal position as explained in greater detail here, the chromatic aberrations also include the wavelength dependence of the magnification scale. This effect is also encompassed by the aberration parameter $\alpha$.

The second influencing variable under consideration here that influences the lithography process is the dynamic speckles. Speckles arise as a result of uncontrolled or uncontrollable interference between different parts of the laser beam. The interference results in extinction of the light at some locations, which corresponds to a contrast of 100%. The exact form of the speckles pattern is dependent on the phase relationships of the different parts of the laser beam, which change over the course of time. These temporal intensity fluctuations are referred to as "temporal speckles" or "dynamic speckles" in the technical literature. If it is taken into consideration that the only possibility for reducing contrast in these cases resides in the superimposition of many different speckles patterns during the duration of a laser pulse, then this leads to the question of how rapidly the speckles patterns change. The number of independent speckles patterns results from the duration of the laser pulse, divided by the phase correlation time of the laser radiation. The correlation time in turn results from the different frequencies of the light in the laser radiation, that is to say it is associated with the line shape of the emitted intensity spectrum. For the purposes of this application, said correlation time or coherence time τ results from the following equation:

$$\tau = \frac{\int I(\omega)^2 d\omega}{[\int I(\omega) d\omega]^2} \tag{4}$$

The above equation shows that there is a relationship between the temporal coherence of a light source and its spectral bandwidth. If both variables are defined effectively, then it is evident that the variables are inversely proportional to one another. A further, more intensive analysis shows that the spectral shape of the radiation emitted by the light source also influences this relation.

The aberration parameter α is proportional to the square of the bandwidth, while the coherence time τ is proportional to the reciprocal of the bandwidth. One important conclusion from this insight is that the product $\alpha\tau^2$ is independent of the bandwidth. This in turn means that the bandwidth of the laser radiation source for a lithography process can be chosen on the basis of technological parameters, and that the spectral line shape parameterized by means of the line shape parameter $\alpha\tau^2$ remains as a free parameter in order to obtain an optimization between the influence of the radiation source on the chromatic aberrations and the influence of the radiation source on the generation of dynamic speckles.

The magnitude of the line shape parameter will now be explained in greater detail below for various laser line shapes.

In textbooks it is often explained that the spectral shape of a laser line is a Lorentz profile:

$$I(\omega) = \frac{1}{1 + \left|\frac{\omega}{2\Delta}\right|^2} \tag{6}$$

However, this is only a coarse approximation that is valid in direct proximity to the center of the line. A more expedient approach that is widely used in laser physics is that of a modified Lorentz curve.

$$I(\omega) = \frac{1}{1 + \left|\frac{\omega}{2\Delta}\right|^\nu}, \nu > 2 \tag{7}$$

In order that the chromatic aberration α does not diverge, that is to say in order that optical lithography is possible at all, it is necessary that ν>3. For the chromatic aberrations it is then evident that $$\alpha = 4\Delta^2 \frac{\sin(\pi/\nu)}{\sin(3\pi/\nu)} \tag{8}$$

and for the coherence time $$\tau = \frac{[\nu - 1]\sin(\pi/\nu)}{4\pi\Delta} \tag{9}$$

The value for ν can be calculated from the FWHM (full width at half maximum) and the E95 value (95% of the energy is within this frequency range). These values are thus accessible through spectroscopic measurement technology.

Figure 3:
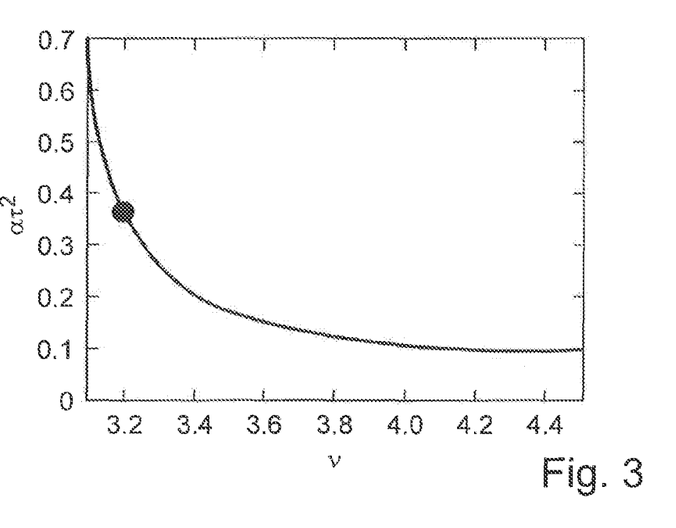
FIG. 3 shows a diagram concerning spectral properties of the laser radiation of a conventional laser.

From measurement data for an XLA-360 laser as reference laser, it was found that e.g. ν=3.2. If the line shape parameter $\alpha\tau^2$ is plotted as a function of ν, this results in the curve shown in FIG. 3. The dot marks the value ν=3.2 of the commercially available, "real" laser which corresponds to a value of the line shape parameter of approximately $\alpha\tau^2$=0.38. The limit of $\alpha\tau^2$ for ν→∞ is $\alpha\tau^2$=1/12 (or $\alpha\tau^2$≈0.083), such that only marginal improvements can be obtained beyond ν=4.5.

Even upon restriction to modified Lorentz functions as conceivable spectral line shapes, $\alpha\tau^2$ can therefore be improved by more than a factor of 3 relative to the reference laser.

If other spectral line shapes are allowed, in particular a parabolic shape, then a greater improvement is even possible, which will be explained below.

Different indications for ν exist for different commercially available lasers, to be precise in the range of ν=3.2 to ν=3.75. It is assumed that the differences can be attributed only in part to the lasers, but can be attributed in respect to the other part to the measurement and the evaluation. It thus remains to assess how large the improvement potential for the individual lasers actually is. A direct integration of a measured laser profile for the XLA-360 resulted in $\alpha\tau^2$≈0.26, while the detour via a computational fit of ν resulted in approximately $\alpha\tau^2$=0.36 (see FIG. 3).

These numbers have to be compared with the limit value 1/12≈0.083 for the modified Lorentz function and 9/125≈0.072 for a parabolic shape.

Figure 4A:
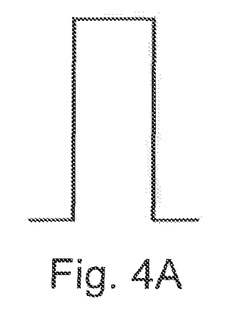
FIG. 4A-C schematically shows different possible spectral line shapes of laser radiation.
Figure 4B:
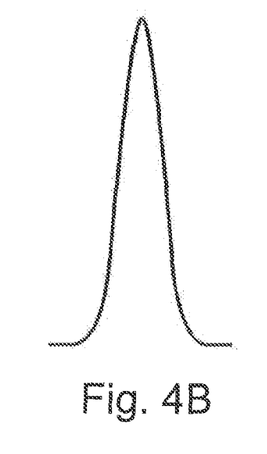
Figure 4C:
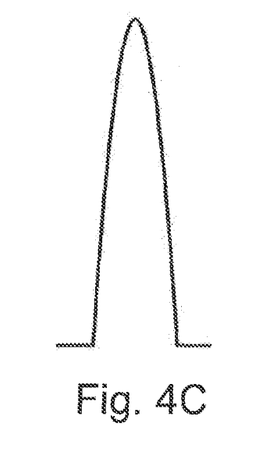

In order to make the advantages of the disclosure somewhat clearer, simple examples shall be shown here with reference to FIG. 4:

The line shape I(ω) shown in FIG. 4A shall be considered to be a (spectral) flat top having the width Δ. It is then the case that $\alpha=\Delta^2/12$ results from equation (1), and τ=1/Δ results from equation (4). The product or the line shape parameter is thus $\alpha\tau^2$=1/12 (≈0.083).

If a Gaussian curve (as a function of the frequency) having a width σ is assumed instead for I(ω) (FIG. 4B), then $\alpha=\sigma^2/2$ results from equation (1), and τ=1/[I(2π)σ] results from equation (4). The product or the line shape parameter $\alpha\tau^2$ is thus $\alpha\tau^2$=1/(4π)≈0.080.

The product $\alpha\tau^2$ is therefore somewhat smaller for a Gaussian curve than for a flat top. Therefore, a somewhat shorter coherence length and thus fewer speckles can be achieved for a Gaussian curve given constant chromatic aberrations. Alternatively, given the same speckles, the chromatic aberrations can be reduced if a Gaussian curve is used instead of a flat top. In other words: a laser line having a Gaussian shape is suited to the optical lithography better than a flat top if it is important to reduce the influence of the temporally varying speckles on image generation by comparison with conventional systems and methods, without simultaneously increasing the influence of chromatic aberrations on image generation.

The condition that the product $\alpha\tau^2$ in accordance with equation (1) and equation (4) is intended to be minimized produces a mathematically well-defined problem. The following optimized line shape was determined by means of a Monte Carlo simulation. The laser line in this optimized variant has the shape of a cut-off parabola (also see FIG. 4C).

$$I(\omega) = \begin{cases} c\left[1 - \left(\frac{\omega}{\Delta}\right)^2\right] & |\omega| \leq \Delta \\ 0 & |\omega| \geq \Delta \end{cases} \quad (10)$$

For this curve shape, $\alpha=\Delta^2/5$ and $\tau=3/(5\Delta)$, and the resulting product $\alpha\tau^2$ is $\alpha\tau^2=9/125$, corresponding to $\alpha\tau^2\approx 0.072$. The products (line shape parameters) $\alpha\tau^2$ for the different curve shapes are therefore Flat top: $\alpha\tau^2=1/12\approx 0.083$ Gaussian curve: $\alpha\tau^2=1/(4\pi)\approx 0.080$ Parabolic shape: $\alpha\tau^2=9/125\approx 0.072$ The parabolic shape is therefore actually better than the Gaussian profile or the flat top profile.

The examples show that, for the problem explained here, it is important what happens in the regions of the flanks of an intensity profile. If e.g. 1% of the total energy within the flanks is shifted, then this has an influence that is orders of magnitude greater than if 1% of the total energy within the line core is shifted. Therefore, a laser line shape should have a smallest possible flank contribution, where the term "flank" here substantially denotes the transition region between line core and line wing. In this sense, a Gaussian curve has wider flanks than the parabola—the flanks theoretically go to infinity in the case of a Gaussian curve, while they have only a finite extent in the case with a parabola. If, by contrast, the flanks are completely cut off as in the case of a flat top, then part of the core now becomes the flank, because everything on the outside is, after all, a type of flank. In the case of a flat top, therefore, a region having a very high intensity becomes the flank. The parabola is therefore a very good compromise against the background of the underlying problem.

Figure 5:
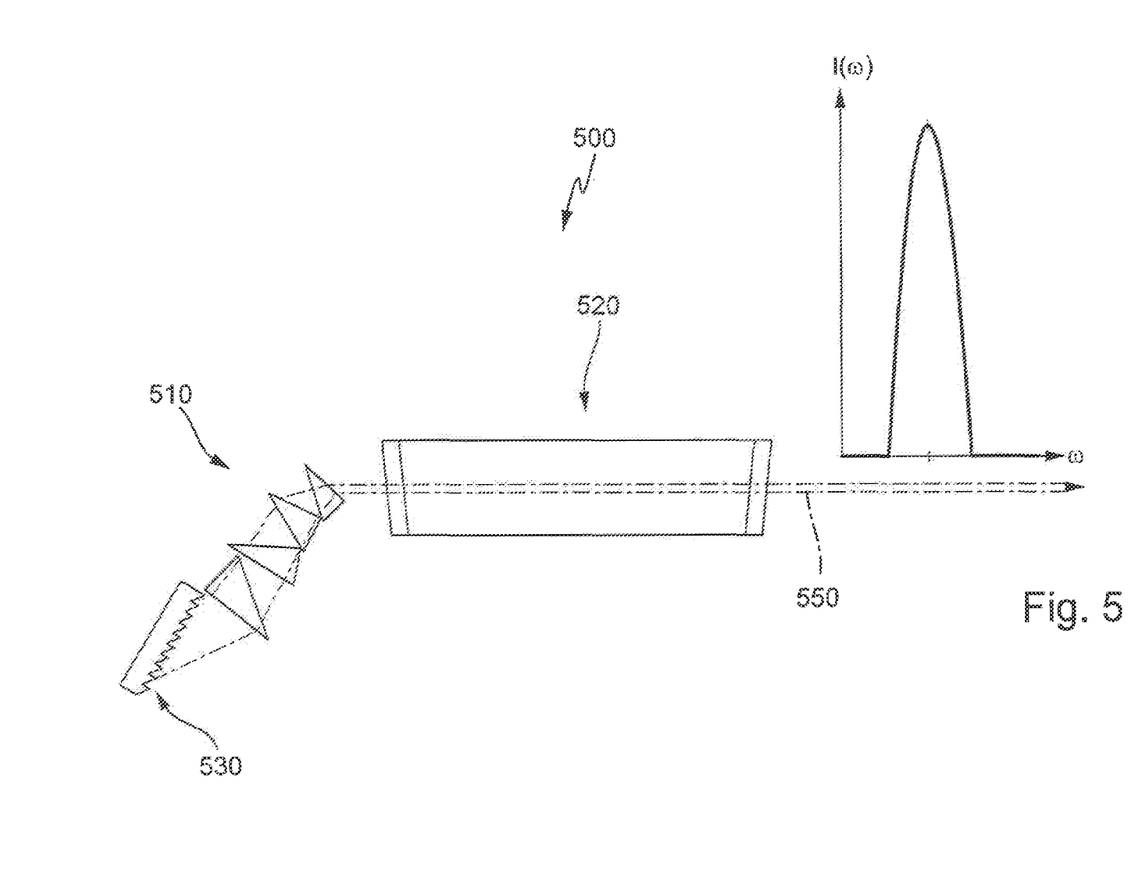
FIG. 5 schematically shows the construction of an excimer laser with a bandwidth narrowing module.

With reference to FIG. 5, one possibility for influencing the spectral line shape in the case of an excimer laser will be given on the basis of an example. Excimer lasers are currently the primary light sources principally used for microlithography in the DUV and VUV range. An excimer laser oscillates in many different spatial modes and has a low degree of spatial coherence in comparison with other types of laser. Moreover, a relatively wide spectrum is emitted, which means low temporal coherence. An additional factor is significantly higher emission powers than in the case of conventional non-laser sources in the UV range. The natural bandwidth of an excimer laser can be in the range of several hundred pm and must therefore be considerably narrowed in order to yield a narrow bandwidth suitable for microlithography. Therefore, excimer lasers for microlithography are equipped with so-called bandwidth narrowing modules. In the case of the laser radiation source from FIG. 5, the bandwidth narrowing module 510 forms the backward resonator termination of the laser and has the function of reducing the bandwidth of the emitted laser radiation by wavelength-selective reflection. Adjacent to the rear coupling-out window of an amplifying or gas discharge chamber 520 is a beam expanding unit 512 comprising four suitably arranged prisms lying one behind another. The expanded laser beam impinges on an echelle grating 530 in a Littrow configuration, such that the incident expanded laser beam is reflected on itself. This basic construction is known per se. The spectral line profile of the laser is now substantially determined by the spectral reflectivity of the echelle grating 530. By means of blazed ruling of the grating, or in some other way, the height profile of the grating can be defined during production in such a way as to produce the desired spectral intensity distribution in the emerging laser beam 550.

In the exemplary embodiment, the height profile of the echelle grating 530 is designed in such a way that the laser radiation 550 emitted by the laser 500 has a spectral line shape in the manner of a downwardly open parabola which can substantially be parameterized by the description indicated in equation (10).

The desired spectral line shape of the emitted laser beam is predetermined during the production of the reflection grating 530 for the bandwidth narrowing module. The height profile of the reflection grating that leads to this line shape is determined therefrom by back-calculation. The reflection grating is subsequently produced by means of production methods known per se, for example by blazed ruling.

It has been shown how the lithography process can be improved by suitable setting of the spectral line shape. A factor of 4 for the line shape parameter $\alpha\tau^2$ means—given the same chromatic aberrations—a coherence time that is shorter by the factor 2, and hence a speckle reduction by a factor of $\sqrt{2}\approx 1.5$. The same speckle reduction could also be achieved by means of pulse length doubling by a pulse stretcher, although this would reduce the transmission by approximately 20%. By contrast, an increase in the bandwidth for the purpose of reducing the coherence time would necessitate costly measures for better color correction in the objective. By contrast, the proposed setting of the spectral line shape of the laser is a technical measure that has no relative negative consequences.

The invention claimed is:

1. A projection exposure method for the exposure of a radiation-sensitive substrate arranged in the region of an image surface of a projection objective with at least one image of a pattern of a mask arranged in the region of an object surface of the projection objective, comprising:

generating laser radiation having a spectral intensity distribution $I(\omega)$ dependent on an angular frequency $\omega$, wherein the laser radiation is characterized by an aberration parameter $\alpha$ in accordance with:

$$\alpha := \frac{\int I(\omega)\omega^2 d\omega}{\int I(\omega) d\omega}$$

and a coherence time $\tau$ in accordance with:

$$\tau = \frac{\int I(\omega)^2 d\omega}{[\int I(\omega) d\omega]^2}$$

introducing the laser radiation into an illumination system for generating an illumination radiation directed onto the mask;

imaging the pattern onto the substrate using a projection objective;

wherein the spectral intensity distribution is set so that $\alpha\tau^2 \leq 0.3$.

2. The projection exposure method of claim 1, wherein the spectral intensity distribution is set so that $\alpha\tau^2 \leq 0.1$.

3. The projection exposure method of claim 1, wherein the spectral intensity distribution $I(\omega)$ corresponds to a Gaussian curve of the full width at half maximum $\sigma$, wherein $\alpha=\sigma^2/2$ and $\tau=1/(\sqrt{2\pi}\sigma)$.

4. The projection exposure method of claim 1 wherein the spectral intensity distribution $I(\omega)$ has a parabolic shape.

5. The projection exposure method of claim 1, wherein a maximum of the spectral intensity distribution lies in the ultraviolet range at a wavelength of less than 260 nm.

6. A projection exposure apparatus for the exposure of a radiation-sensitive substrate arranged in the region of an image surface of a projection objective with at least one image of a pattern of a mask arranged in the region of an object surface of the projection objective, comprising:
 a primary laser radiation source for emitting laser radiation;
 an illumination system for receiving the laser radiation and for generating an illumination radiation directed onto the mask;
 a projection objective for generating an image of the pattern in the region of the image surface of the projection objective;
 wherein the laser radiation source is designed for generating laser radiation having a spectral intensity distribution $I(\omega)$ dependent on an angular frequency $\omega$, wherein the laser radiation is characterized by an aberration parameter $\alpha$ in accordance with:

$$a := \frac{\int I(\omega)\omega^2 d\omega}{\int I(\omega)d\omega}$$

and a coherence time $\tau$ in accordance with:

$$\tau = \frac{\int I(\omega)^2 d\omega}{[\int I(\omega)d\omega]^2},$$

wherein the spectral intensity distribution is set so that $\alpha\tau^2 \leq 0.3$.

7. The projection exposure apparatus of claim 6, wherein the spectral intensity distribution is set so that $\alpha\tau^2 \leq 0.1$.

8. The projection exposure apparatus of claim 6, wherein the spectral intensity distribution $I(\omega)$ corresponds to a Gaussian curve of the full width at half maximum $\sigma$, wherein $\alpha=\sigma^2/2$ and $\tau=1/(\sqrt{2\pi}\sigma)$.

9. The projection exposure apparatus of claim 6, wherein the spectral intensity distribution $I(\omega)$ has a parabolic shape.

10. The projection exposure apparatus of claim 6, wherein a maximum of the spectral intensity distribution lies in the deep ultraviolet range at a wavelength of less than 260 nm.

11. A laser radiation source for generating laser radiation having a spectral intensity distribution $I(\omega)$ dependent on an angular frequency $\omega$ for use in a projection exposure apparatus as claimed in claim 6, wherein the laser radiation is characterized by an aberration parameter $\alpha$ in accordance with:

$$a := \frac{\int I(\omega)\omega^2 d\omega}{\int I(\omega)d\omega}$$

and a coherence time $\tau$ in accordance with:

$$\tau = \frac{\int I(\omega)^2 d\omega}{[\int I(\omega)d\omega]^2}.$$

wherein the spectral intensity distribution is set so that $\alpha\tau^2 \leq 0.3$.

12. The laser radiation source of claim 11, wherein the spectral intensity distribution is set so that $\alpha\tau^2 \leq 0.1$.

13. The laser radiation source of claim 11, wherein the spectral intensity distribution $I(\omega)$ corresponds to a Gaussian curve of the full width at half maximum $\sigma$, wherein $\alpha=\sigma^2/2$ and $\tau=1/(\sqrt{2\pi}\sigma)$.

14. The laser radiation source of claim 11, wherein the spectral intensity distribution $I(\omega)$ has a parabolic shape.

15. The laser radiation source of claim 11, wherein a maximum of the spectral intensity distribution lies in the deep ultraviolet range at a wavelength of less than 260 nm.

16. The laser radiation source of claim 11, further comprising a bandwidth narrowing module comprising a reflection grating for the wavelength-selective reflection of laser radiation of a resonator of the laser radiation source, wherein a spectral intensity distribution of the laser radiation is substantially determined by a spectral reflectivity of the reflection grating, and a height profile of the reflection grating is defined so that $\alpha\tau^2 \leq 0.3$.

17. A bandwidth narrowing module for the laser radiation source of claim 11, comprising a reflection grating for the wavelength-selective reflection of laser radiation of a resonator of the laser radiation source, wherein a spectral intensity distribution of the laser radiation is substantially determined by a spectral reflectivity of the reflection grating, and a height profile of the reflection grating is defined so that a spectral intensity distribution $I(\omega)$ dependent on the angular frequency $\omega$ results for the laser radiation, wherein the laser radiation is characterized by an aberration parameter $\alpha$ in accordance with:

$$a := \frac{\int I(\omega)\omega^2 d\omega}{\int I(\omega)d\omega}$$

and a coherence time $\tau$ in accordance with:

$$\tau = \frac{\int I(\omega)^2 d\omega}{[\int I(\omega)d\omega]^2}.$$

wherein $\alpha\tau^2 \leq 0.3$.

18. The bandwidth narrowing module of claim 17, wherein the height profile of the reflection grating is designed so that the spectral intensity distribution $I(\omega)$ substantially corresponds to a Gaussian curve of the full width at half maximum $\sigma$, wherein $\alpha=\sigma^2/2$ and $\tau=1/(\sqrt{2\pi}\sigma)$.

19. The bandwidth narrowing module of claim 17, wherein the height profile of the reflection grating is designed so that the spectral intensity distribution $I(\omega)$ substantially has a parabolic shape.

* * * * *

UNITED STATES PATENT AND TRADEMARK OFFICE
CERTIFICATE OF CORRECTION

PATENT NO. : 8,896,816 B2  
APPLICATION NO. : 13/208472  
DATED : November 25, 2014  
INVENTOR(S) : Michael Patra Page 1 of 1

It is certified that error appears in the above-identified patent and that said Letters Patent is hereby corrected as shown below:

In the Specification,

Col. 2, line 50, delete "$\mu$m" and insert --pm--.

Signed and Sealed this  
Thirty-first Day of March, 2015

Michelle K. Lee  
*Director of the United States Patent and Trademark Office*